(12) United States Patent
Gopal et al.

(10) Patent No.: US 9,753,666 B2
(45) Date of Patent: Sep. 5, 2017

(54) EFFICIENT DATA COMPRESSION FOR SOLID-STATE MEMORY

(71) Applicant: Intel Corporation, Santa Clara, CA (US)

(72) Inventors: Vinodh Gopal, Westborough, MA (US); Kirk S. Yap, Westborough, MA (US); James D. Guilford, Northborough, MA (US); Jawad B. Khan, Cornelius, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 14/671,929

(22) Filed: Mar. 27, 2015

(65) Prior Publication Data

US 2016/0283159 A1    Sep. 29, 2016

(51) Int. Cl.
G06F 13/00         (2006.01)
G06F 3/06          (2006.01)
H03M 7/30          (2006.01)
G06F 12/0875       (2016.01)
G06F 12/0895       (2016.01)

(52) U.S. Cl.
CPC ............ *G06F 3/0638* (2013.01); *G06F 3/061* (2013.01); *G06F 3/0671* (2013.01); *G06F 12/0875* (2013.01); *G06F 12/0895* (2013.01); *H03M 7/3086* (2013.01); *H03M 7/3095* (2013.01); *H03M 7/6058* (2013.01); *G06F 2212/401* (2013.01); *G06F 2212/60* (2013.01)

(58) Field of Classification Search
CPC .................................. H03M 7/40; H03M 7/30
See application file for complete search history.

(56) References Cited

U.S. PATENT DOCUMENTS 5,502,439 A * 3/1996 Berlin ................. H03M 7/3086
                                                   341/106
5,778,255 A * 7/1998 Clark .................. H03M 7/3086
                                                    341/51

(Continued)

OTHER PUBLICATIONS

Microsoft, "2.1.1.1.1 LZ77 Compression Algorithm", published Jun. 2012.*

(Continued)

*Primary Examiner* — Charles Rones
*Assistant Examiner* — Han Doan
(74) *Attorney, Agent, or Firm* — Lowenstein Sandler LLP

(57) ABSTRACT

Compression and decompression technology within a solid-state device (SSD) is disclosed that provides a good compression ratio while taking up less on-chip area. An input interface receives an input stream to be compressed. An output interface provides a compressed stream. A history buffer is of a fixed size that is a fraction of a size of a data buffer. Processing logic encodes into the compressed stream element types, literals and pointers, the latter which reference copies of data found elsewhere within the history buffer during compression. The history buffer may be multiple banks in width, where the data is loaded from the input stream sequentially across rows of the banks. The decompression side may be similarly designed, optionally with a different number of banks. The pointers may be a fixed two bytes including four bits for length and eleven bits for offset of back reference to a copy (or other combination).

19 Claims, 11 Drawing Sheets

(56) References Cited

U.S. PATENT DOCUMENTS

| | | | | |
|---|---|---|---|---|
| 5,933,104 | A * | 8/1999 | Kimura | H03M 7/3086 341/51 |
| 7,446,679 | B1 * | 11/2008 | Han | H03M 7/3086 341/51 |
| 7,673,115 | B1 * | 3/2010 | Don | G06F 3/0619 711/163 |
| 2004/0017772 | A1 * | 1/2004 | Saito | G06F 13/385 370/229 |
| 2004/0151203 | A1 * | 8/2004 | Gulati | H04L 49/552 370/465 |
| 2011/0071990 | A1 * | 3/2011 | Biran | H03M 7/3086 707/693 |
| 2011/0154169 | A1 * | 6/2011 | Gopal | H03M 7/3084 714/807 |
| 2011/0176556 | A1 * | 7/2011 | Guo | H04L 1/0041 370/474 |
| 2013/0021179 | A1 * | 1/2013 | Jaquette | H03M 7/40 341/67 |

OTHER PUBLICATIONS

Data Compression in the Intel Solid-Sate Drive 520 Series, Intel labs data, 2 pages, Intel Corporation, USA (2012).

\* cited by examiner

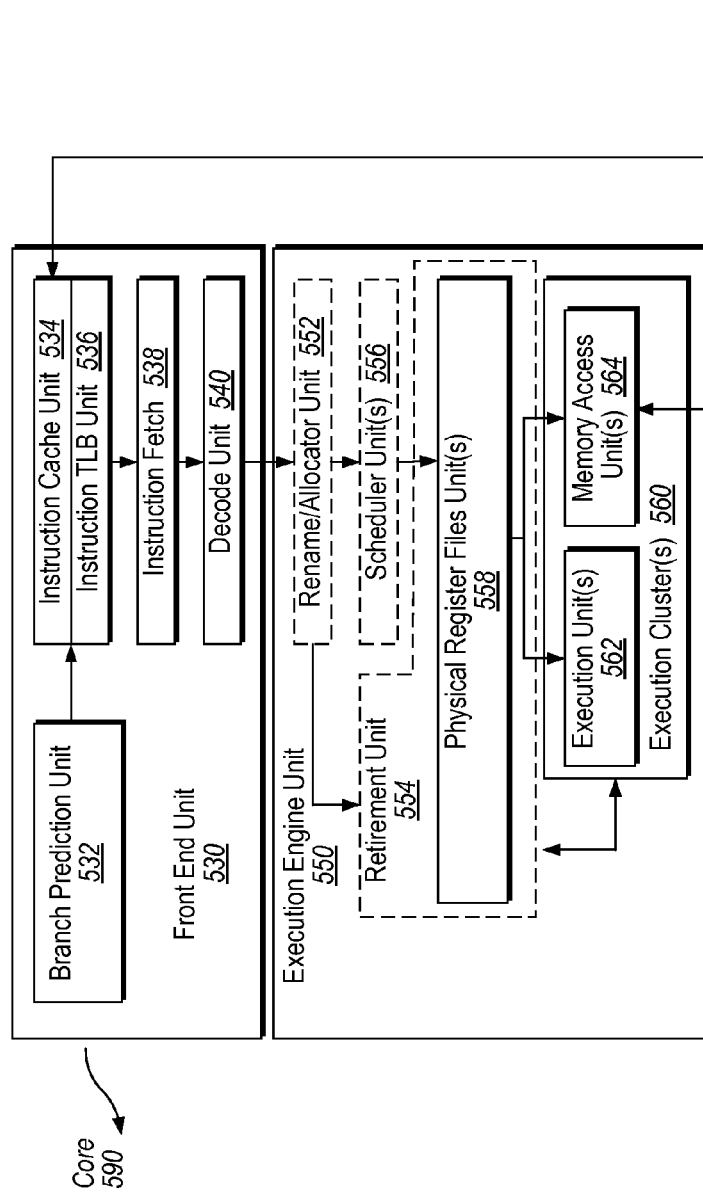

EFFICIENT DATA COMPRESSION FOR SOLID-STATE MEMORY

The present disclosure pertains to the field of memory management and, in particular, to optimizing compression and decompression in solid-state memory devices.

BACKGROUND

Solid-state drives (SSD) or other memory devices based on arrayed semiconductors have become very popular, but have only recently been produced with compression capability. Compression can result in significant reduction of write traffic to non-volatile memory (NVM) from a host device. The reduction in NVM writes causes corresponding reduction in the write amplification, which implies better performance, reliability, wear-leveling and less power consumption. Recovered area of SSD's can be exposed to the host device, effectively lowering the price per gigabyte of the SSD's Based on desired bandwidth and process speeds, however, choosing a compression ratio presents challenges. With choice of a sufficiently high compression ratio, current LZ77-based algorithms considered best for implementation (e.g., LZ4, LZFX, LZSS, Snappy) are very costly, requiring in excess of three million gates. The tradeoffs between smaller area designs with less circuitry and good performance is a significant challenge. What is needed, therefore, is a less expensive compression/decompression design and methodology that meets favorable compression rations, bandwidth and speed.

BRIEF DESCRIPTION OF THE DRAWINGS

FIG. 5A is a block diagram illustrating an in-order pipeline and a register renaming stage, out-of-order issue/execution pipeline according to one embodiment.

FIG. 5B is a block diagram illustrating a micro-architecture for a processor that implements compression/decompression optimization in solid-state memory devices according to one embodiment.

DESCRIPTION OF EMBODIMENTS

Figure 1:
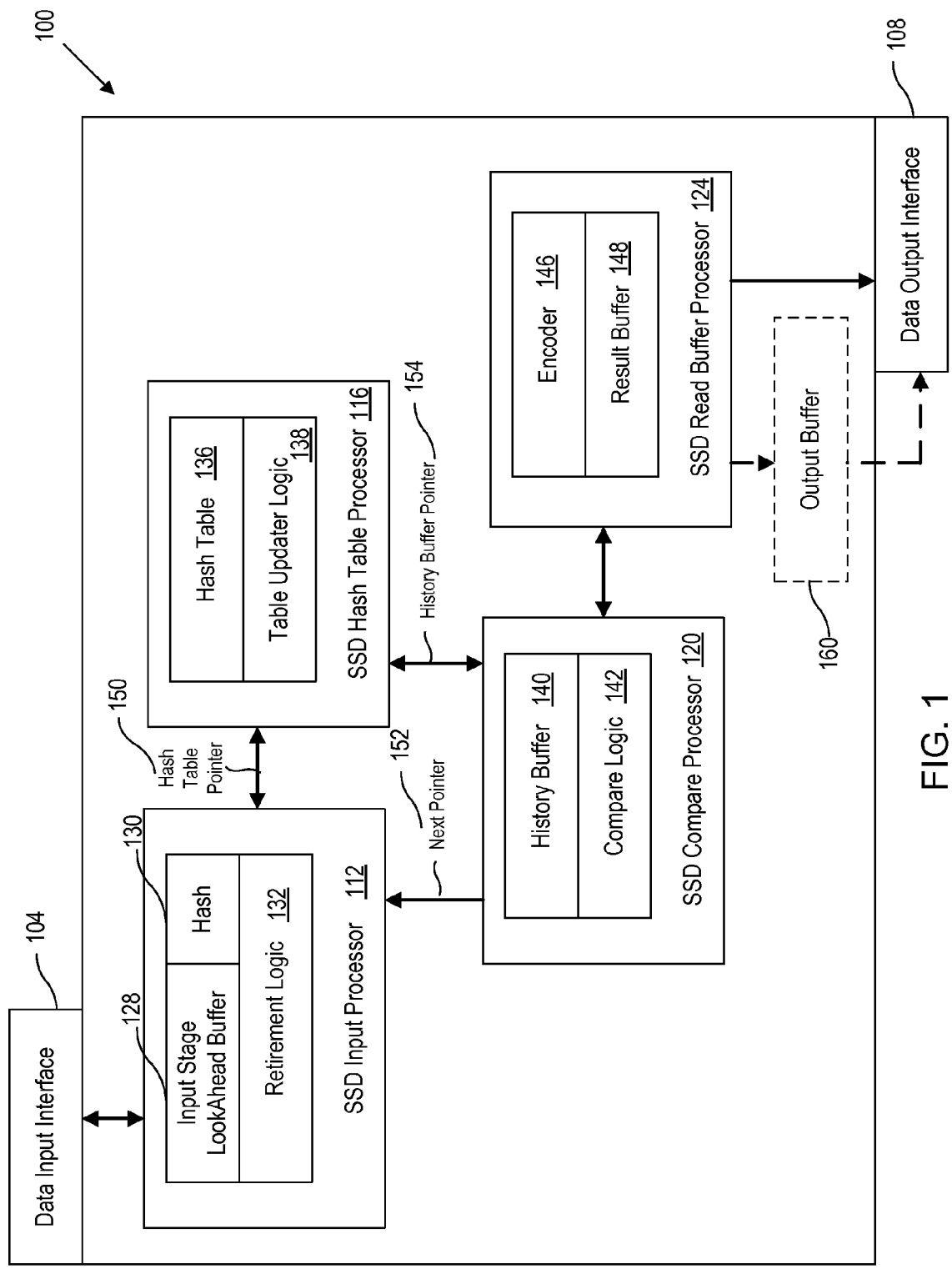
FIG. 1 is a diagram of an exemplary compression engine.

Affordable compression and decompression technology within a solid-state device (SSD) is disclosed that provides a good compression ratio while taking up less on-chip area. A data input interface receives an input stream to be compressed. A data output interface provides a compressed stream. A history buffer may be of a fixed size that is a fraction of a size of a data buffer used to read the input stream. Processing logic encodes into the compressed stream element types, including literals and pointers, the latter which reference copies of data records found elsewhere within the history buffer during compression of the input stream. The history buffer may be multiple banks in width, where the data is buffered from the input stream sequentially across rows of the banks. The decompression side may be similarly designed, optionally with a history buffer with a different number of banks and/or of a different fixed size.

The pointers may be two bytes including a bit for element type, four bits for length, and eleven bits for offset of back reference to a copy. A different breakdown of bits between length and offset may be used, with various tradeoffs between compression ratio, speed and cost in number of gates for design of compression/decompression engines.

A format used for SSD compression should be designed to get a good compression ratio, meets aggressive read/write throughput rates (e.g., bandwidth) at a low clock frequency, minimize impact to read-latency (e.g., fast decompression latency), and be amenable to a low-cost implementation (e.g., fewer gates or circuits). The present design came out of the following general design requirements: 4-8 GB/second for reads and writes (compression and decompression), strict limits on latency, with a frequency target of about 400 MHz on devices with data buffers of fixed-sized blocks (e.g., 4 KB). Strict limits on latency may include, for example, that latency for reading data from the SSD does not increase by more than 10% when using compression as opposed to not using compression.

Use of a current LZ77 algorithm was an initial choice because the LZ77 compression algorithm finds repeated substrings and replaces them with pointers (also referred to as "backward references" or just "references") with relative distance offsets. The compressed data, therefore, includes a series of elements of two types: literal bytes (or just "literals") and pointers to replicated strings of data (e.g., copies). A pointer may be represented as pair: <length, backward distance offset> or (L,O) herein. Literals have no matching string or record within the history buffer, and are thus passed to an output stream without compression, but do include length encoding.

Many existing algorithms are defined with history buffer sizes that do not match the expected usage of compressing 4 KB blocks (e.g., 8 KB through 64 KB) as is common in SSD memory. To reduce the complexity and expense of the present design, the history buffer may be set to a size that is some fraction of the data buffer used to read the input stream. The SSD data buffer size of some SSD's, for example, is 4 KB, so a fraction of that value could set the history buffer at a size of 1 KB, 2 KB or 3 KB. It may be preferred to choose a history buffer that is half the size or smaller of the data buffer.

The disclosed compression/decompression format used in conjunction with updated micro-architecture design has been found to use about a million gates, which is three times better than with any standard LZ77 algorithmic scheme. The disclosed format and architecture also saw a 39% data reduction on real-world user workload and about 50% reduction on enterprise database applications. The disclosed format showed better compression than LZFX and almost comparable but slightly lower compression than LZ4, a high-cost hardware implementation of compression/decompression.

FIG. 1 is a diagram of an exemplary compression engine 100. The compression engine 100 may include, but not be limited to, a data input interface 104, a data output interface 108, a solid-state drive (SSD) input processor 112, a SSD hash table processor 116, a SSD compare processor 120, and an SSD read buffer processor 124. These processors may include logic in the form of hardware (e.g., circuitry, dedicated logic, programmable logic, microcode, etc.), software (e.g., instructions run on a processing device to perform hardware simulation), or a combination thereof.

The SSD input processor 112 may further include an input stage lookahead (or data) buffer 128, a hash 130, retirement logic 132. The SSD hash table processor 116 may further include a hash table 136 and table updater logic 138. The SSD compare processor 120 may further include a history buffer 140 and compare logic 142. The SSD read buffer processor 124 may further include an encoder 146 and a result buffer 148.

An input stream of data comes into the compression engine 100 through the data input interface 104. Based on a current coding position (e.g., the position of the byte at the start of the lookahead buffer 128 currently being coded), the retirement logic 132 hashes the next four bytes with the hash 130 and the resultant hash value is used to lookup an address in the hash table 136. The hash table contains the addresses of the most recent locations with the same hash. A valid entry from the hash table 136 is used to read data from the history buffer 140. The table updater logic 138 may subsequently update the hash table 136 with the new address at the location to where the hash value points. A valid pointer is one from a hash table entry that was written during the current compression session. That is, there is an array of one-bit values with one value per hash table entry. Initially, this table of valid bits is cleared. As each hash table entry is written, the corresponding valid bit is set. When a hash table is being read, the corresponding bit is read, and if it is 0 (zero), then the pointer read is considered invalid. Logically, the hash table is initialized with a special value indicating "invalid," and if this value is read, it is not used to index into the history buffer.

The compare logic 142 may be used to compare data from the history buffer against the current data in the lookahead buffer 128 for the longest matching data string (also referred to as copies or records) for which a pointer is created. If no match is found, a null pointer may be created (meaning no match) and the string of data is sent to the result buffer 148 as a literal (e.g., not compressed). A compression algorithm processes a window of data the size of the history buffer that slides along the input stream, searching backwards from a coding position. The pointers are encoded with length ("L") and offset ("O") information, which will be discussed in more detail in FIGS. 4A and 4B. Briefly, the length is the number of bytes of the copy and the offset is how far back from the coding position along the input stream the referenced copy is located (so that a decompression engine can later recreate the same stream of data).

Literals and the pointer information may be sent to the result buffer 148 for encoding by the encoder 146. The encoder 146 may then code the compressed stream in the proper order according to literals and pointers based on the matching performed by the compare logic 142. The data output interface 108 may then output a compressed data stream prepared by the encoder 146 from the result buffer 148. In some embodiments, an output buffer 160 may be used intermediate of the SSD read buffer processor and the data output interface to delay sending out the compressed data stream, e.g., until a certain amount of data (e.g., in 8 byte increments up to 64 bytes) is aggregated for output.

To provide a simple example to show how the compression engine 100 works, Table 1 represents a sample input stream, indicating the value of a series of bytes according to coding position in the input stream.

TABLE 1

| | Position | | | | | | | | |
|---|---|---|---|---|---|---|---|---|---|
| | 1 | 2 | 3 | 4 | 5 | 6 | 7 | 8 | 9 |
| Byte | A | A | B | C | B | B | A | B | C |

Table 2 shows the output of the compression engine 100 based on an exemplary algorithm according to coding position. The step indicates the number of the encoding step. A step in the Table 2 finishes every time that the encoding algorithm (e.g., as executed by the compare table updated logic 138, the compare logic 142, and the encoder 146) makes an output. The "byte" shows the first byte in the lookahead buffer 128 after the match. The match is the longest match found in the window of the history buffer. The byte is the literal detected in the absence of a match. The output is in a format of (O,L)C where (O,L) is the offset and distance pointer, and "C" represents the literal byte in the case of a null pointer. Note that one or more pointers might be included before the positioning of a literal byte, although more than one has not be shown in this simplified example.

TABLE 2

| Step | Position | Match | Byte | Output |
|---|---|---|---|---|
| 1 | 1 | — | A | (0, 0)A |
| 2 | 2 | A | — | (1, 1) |
| 3 | 3 | — | B | (0, 0)B |
| 4 | 4 | — | C | (0, 0)C |
| 5 | 5 | B | — | (2, 1) |
| 6 | 6 | B | — | (1, 1) |
| 7 | 7 | ABC | — | (5, 3) |

Because representing the pointer information itself may require two bytes of data in the output stream, it would be inefficient to represent a single byte that has previously been encoded by two bytes of a pointer. Accordingly, the example algorithm may require at least three bytes of in common to consider the compare logic to have found a match, and therefore generate a pointer for encoding.

Figure 2:
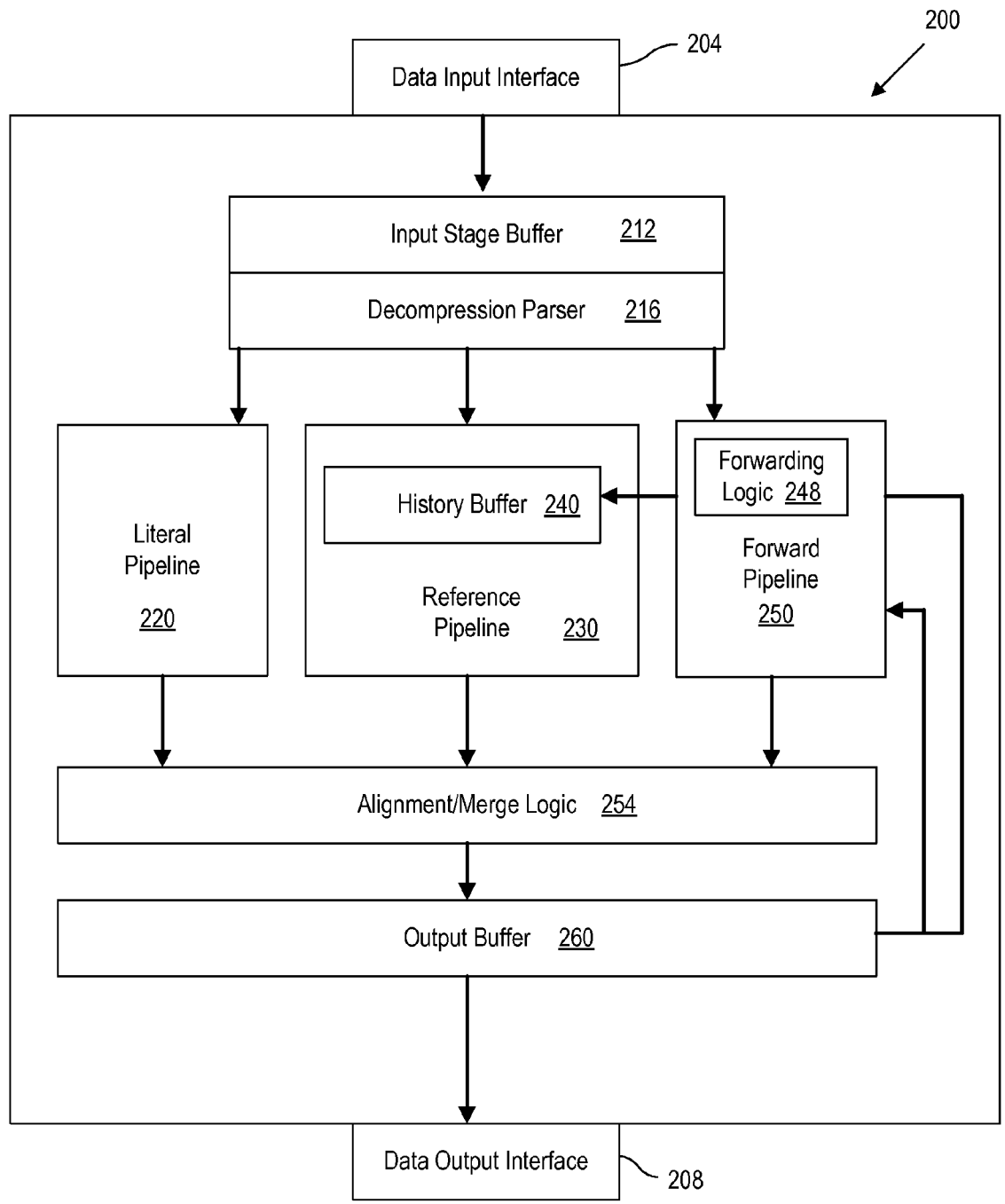
FIG. 2 is a diagram of an exemplary decompression engine.

FIG. 2 is a diagram of an exemplary decompression engine 200. The decompression engine 200 may be configured to decompress blocks of data compressed by the compression engine 100. Accordingly, the decompression engine 200 should be designed to operate with a format consistent with the format used to data compress the stream output by the data output interface 108 (FIG. 1).

In one embodiment, the decompression engine 200 may include a data input interface 204, a data output interface 208, an input stage buffer 212, a decompression parser 216, a literal pipeline 220, a reference pipeline 230, a history buffer 240, forwarding logic 248, a forward pipeline 250, alignment and merge logic 254, and an output buffer 260.

The data input interface 204 receives input data in a compressed stream consisting of a series of records or blocks. The input stage buffer 212 stores a certain amount of the compressed stream, typically somewhere between 8 KB and 64 KB. The decompression parser 216 checks the first bit of each record to determine whether what follows is a literal or pointer with back reference information. When the record is a literal, the parser 216 sends the record to the literal pipeline 220 to be merged with other records obtained from the reference pipeline and/or the forward pipeline 250 at a later stage. The literal pipeline 220 functions to delay the literals until the pointers can be processed.

When the record is a pointer, the parser 216 analyzes the encoding of the pointer to determine its length and offset distance from where the record should be retrieved. When the offset distance is beyond a minimum threshold distance from the coding position (e.g., 24 bytes in one example, although different values can be chosen), the bytes to which the pointer refers are read out of the history buffer 240 and into the reference pipeline. These referenced records may then be later merged with the literals from the literal pipeline.

When the offset distance from the coding position encoded in the pointer is within the minimum threshold distance (referenced above as optionally 24 bytes), the referenced location is too close to have its data been correctly written back into the history buffer 240. More specifically, there is a delay between when data is read out of the history buffer and to when the data is written back to the history buffer 240. In this situation, the parser sends the pointer to the forward pipeline for handling by the forwarding logic 248. The forwarding logic 248 identifies the record and retrieves it from the forward pipeline 250, which is populated with records (from the literal and reference pipelines) ahead of when the records are written back to the history buffer.

The alignment/merge logic 254 may then merge and align the literals from the literal pipeline 220, with the copies (referenced records) from the reference pipeline 230, and with any forwarded records from the forward pipeline 250 into the output buffer 260. Records are aggregated until output when up to a certain size (such as 8 bytes, 16 bytes or some other size). The alignment portion of the logic 254 may need to realign the literals (and any forwarded references) relative to the referenced records because the data coming from the history buffer has an arbitrary alignment, making the locations within the output stream of the referenced records also arbitrary.

Table 3 shows the resultant production of an output stream by the decompression engine 200 based on the input stream output by the encoder 100 as explained with reference to Tables 1 and 2. The step indicates the number of the decoding step. A step in the table finishes every time the decoding algorithm executed by the decompression engine 200 appends the set of bytes identified by the pointer to the output stream. The input pointer is the next pointer from the input stream. The "append bytes" are those that the pointer identifies to be appended to the output stream. The output stream is shown as it looks at the end of each step, understanding that the output stream is normally buffered in the output buffer 260 before being output as a string of bytes.

TABLE 3

| Step | Input Pointer | Append Bytes | Output Stream |
|---|---|---|---|
| 1 | (0, 0)A | A | A |
| 2 | (1, 1) | A | AA |
| 3 | (0, 0)B | B | AAB |
| 4 | (0, 0)C | C | AABC |
| 5 | (2, 1) | B | AABCB |

TABLE 3-continued

| Step | Input Pointer | Append Bytes | Output Stream |
|---|---|---|---|
| 6 | (1, 1) | B | AABCBB |
| 7 | (5, 3) | ABC | AABCBBABC |

Because Tables 1, 2 and 3 show a shortened, simple example, the decompression engine 200 would not have used the history buffer when the minimum threshold distance of 24 bytes was not exceeded to the offset of a pointer. Instead, the forwarding logic would have triggered retrieval from the forward pipeline 250. With longer input streams and delays in the reference pipeline 230, a minimum threshold distance may be adapted for efficient decompression speeds, so the 24-byte value is merely exemplary, and others are envisioned.

Figure 3:
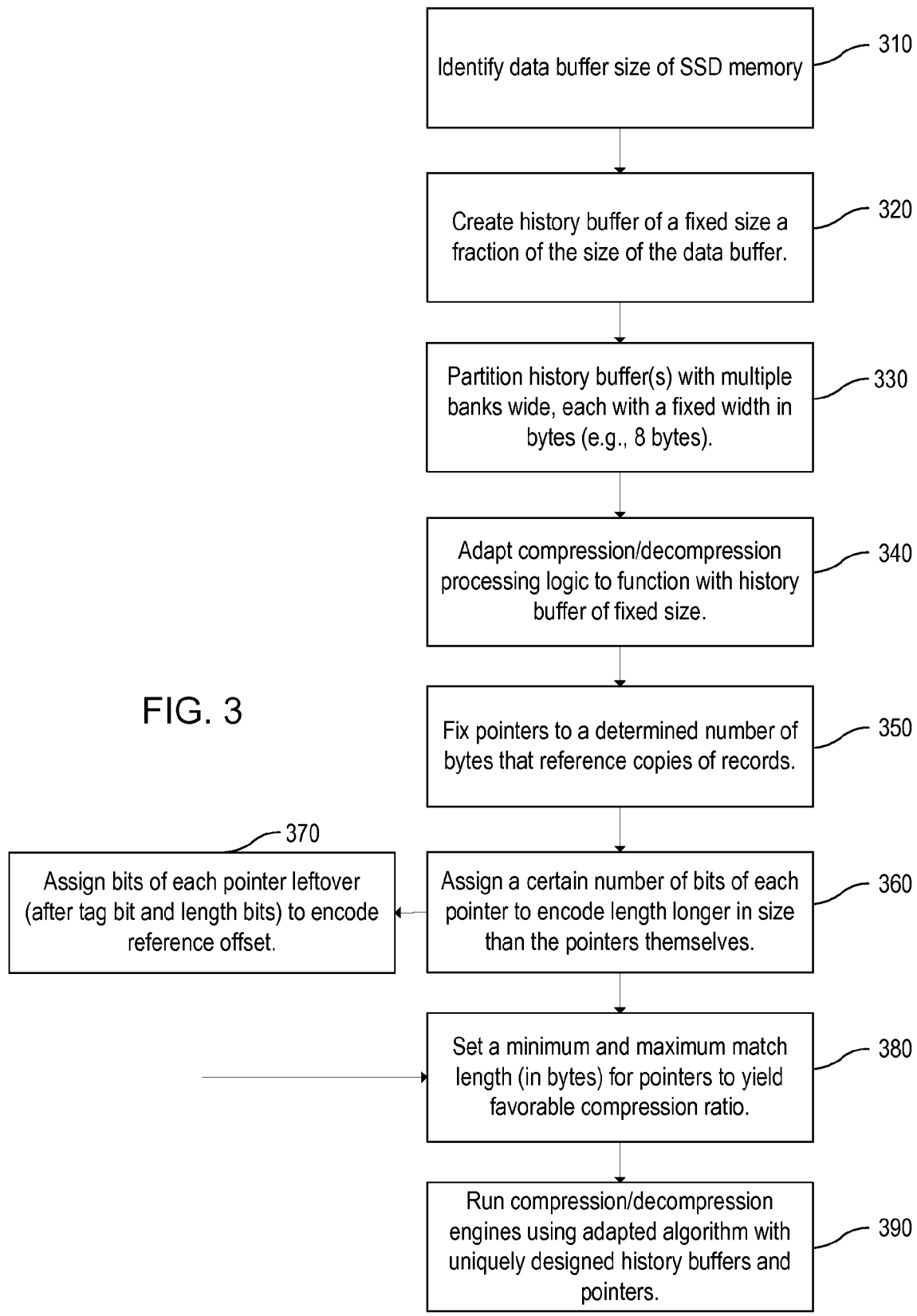
FIG. 3 is a flowchart of an exemplary method for designing compression and decompression engines and pointers used for compression according to one embodiment.

FIG. 3 is a flowchart of an exemplary method for designing compression and decompression engines and pointers used for compression according to one embodiment. The method may include identifying data buffer size of SSD memory, e.g., of the lookahead buffer 128 and input stage buffer 212 (310). The method may further include creating a history buffer of a fixed size that is a fraction of the size of the data buffer (e.g., 20%, 30%, 50%, and the like of the data buffer) (320). The history buffer 240 of the decompression engine 200 may be similarly sized. With further reference to FIG. 1, the history buffer 140 of the compression engine 100 may be half the size of the data buffer, or about 2 KB or less, to reduce the complexity and cost of the on-circuit design.

The method may further include partitioning the history buffers with multiple banks wide, positioned side by side, each with a fixed width in bytes (e.g., 4 bytes, 8 bytes) (330). In one embodiment, the number of banks of the history buffer 140 (e.g., four banks of eight (8) bytes) may be different from the number of banks of the history buffer 240 (e.g., two banks of eight (8) bytes). Alternatively, these history buffer sizes can be swapped or altered in number of banks and size of the banks with various impacts on the throughput of the compression and decompression engines. Built in this fashion, a history buffer with four eight-byte banks can read out 32 bytes in a single cycle and a history buffer with two eight-byte banks can read out 16 bytes in single cycle. In this way, when data is written into the history buffers 140 and 240, the data may be buffered sequentially across the banks in a Ping-Pong fashion.

Because matching strings of data (e.g., copies) may be located in the history buffer with arbitrary alignment, the multiple banks may allow matching data to be read out of the history buffer in a single cycle. For example, assume a history buffer has N banks each of a width, W. This history buffer can be read out (W*(N−1)+1) number of bytes at an arbitrary alignment. So, assume four banks that are eight bytes wide, the compression engine 100 can read out 25 bytes at any alignment. Assuming two banks that are sixteen bytes wide, the compression engine 100 could only read out 17 bytes at any alignment. Accordingly, based on the format of the literals and pointers as described in FIGS. 4A and 4B, and the multiple banks, the disclosed design guarantees a worst case throughput of one (1) byte per cycle.

The method may further include adapting compression logic of the compression engine 100 and decompression logic of the decompression engine 200 to function with the history buffer of the fixed size and having a certain number of banks in width (340). The method may further include fixing pointers to a determined number of bytes that reference copies of records (strings of data) (350). In one embodiment, the pointers may be two bytes in length.

The method may further include assigning a certain number of bits of each pointer to encode length of the pointers that is longer in size than the pointers themselves (360). The method may further include assigning bits of each pointer left (after tag bit and length bits assigned) to encode the reference offset of the pointers (370). This breakdown in bits of the pointers is discussed in more detail with reference to FIG. 4B. The method may further include setting a minimum and a maximum match length (in bytes) for pointers to yield favorable compression ratio (380), discussed in more detail with reference to FIG. 4B. The method may further include running compression/decompression engines using an algorithm adapted with the uniquely designed history buffers and pointers (390).

Figure 4A:
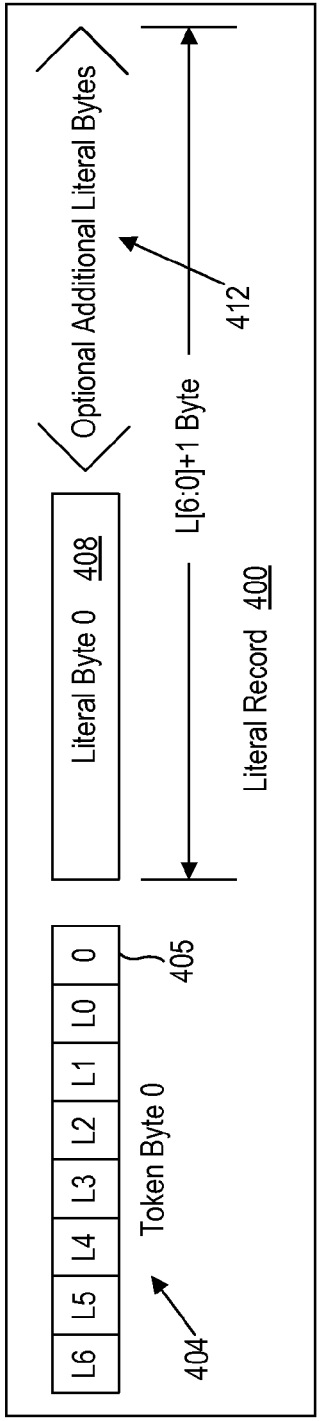
FIG. 4A is a literal record in a compressed stream according to one embodiment.

FIG. 4A is a literal record 400 in a compressed stream according to one embodiment. The literal record 400 may include a token byte 404, which starts with a tag bit 405 that indicates element type and ends with seven bits of encoding length (L0 through L6). A literal byte 408 may follow, in addition to optional additional literal bytes, according to the encoded length—L[6:0] plus one byte. Encoded literals take up more space and impact level of compression available in any given input stream.

Figure 4B:
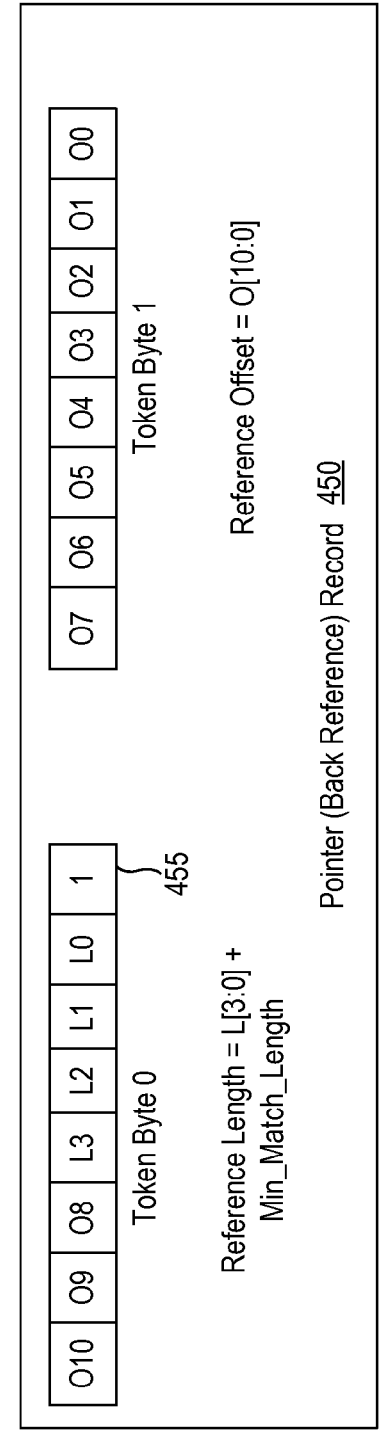
FIG. 4B is a pointer (or back reference) record according to one embodiment.

FIG. 4B is a pointer (or back reference) record 450 according to one embodiment. The pointer record 450 may be designed as fixed in size. In the present example, the size of the pointer record 450 is two bytes, a first token byte (Token Byte 0) and a second token byte (Token Byte 1). The first token byte may begin with a tag bit 455 that indicates element type, be followed by four bits (L0 through L3) for encoding length, and finish with three bits which are added to the eight bits of the second token byte (O0 through O10) to encode for offset within the history buffers 140 and 240 to the copy to which the pointer references.

While different breakdowns of length bits versus offset bits within the two bytes pointer are envisioned, this balance was found to work well to cover a 2 KB history buffer and to result in valid lengths of between four (4) and nineteen (19) bytes of referenced copies. Keeping the history buffers smaller and the length of copies longer provides for good compression ratios while keeping the on-chip surface of the compression and decompression engines 100 and 200 smaller (Table 4). A minimum match length based on the compression/decompression format of FIGS. 4A and 4B was chose as four bytes in the disclosed design. In one embodiment, no extensions are provided to enable longer matches, to simplify the hardware design of the compression and decompression engines 100 and 200, and for good (de)compression performance.

The disclosed design in FIGS. 1 through 4A and 4B provides for the advantage of a deterministic output, e.g., the compressed output is the same for a given input regardless of data arrival timing, stall conditions or other external conditions. A worst case throughput of the disclosed design is one byte per cycle (although this may be pushed to a little more than one byte per cycle due to pipeline startup delays, for example), and the internal latency is low at 11 cycles from first input valid to first byte complete in processing. Furthermore, the worst case stream latency, e.g., the first input valid to first output valid, was found to be 11+63, or 74 cycles. Table 4 summarizes the performance results of the disclosed design.

TABLE 4

| Performance Parameter | Compression | Decompression |
| --- | --- | --- |
| Engine Throughput | 1.1 byte/cycle | 2.9 byte/cycle |
| Engine Worst Case Bandwidth | 1.0 | 2.0 |

FIG. 5A is a block diagram illustrating a micro-architecture for a processor 500 that implements compression/decompression optimization in solid-state memory devices according to one embodiment. Specifically, processor 500 depicts an in-order architecture core and a register renaming logic, out-of-order issue/execution logic to be included in a processor according to at least one embodiment of the disclosure. The embodiments of the page additions and content copying can be implemented in processor 500.

Processor 500 includes a front end unit 530 coupled to an execution engine unit 550, and both are coupled to a memory unit 570. The processor 500 may include a reduced instruction set computing (RISC) core, a complex instruction set computing (CISC) core, a very long instruction word (VLIW) core, or a hybrid or alternative core type. As yet another option, processor 500 may include a special-purpose core, such as, for example, a network or communication core, compression engine, graphics core, or the like. In one embodiment, processor 500 may be a multi-core processor or may be part of a multi-processor system.

The front end unit 530 includes a branch prediction unit 532 coupled to an instruction cache unit 534, which is coupled to an instruction translation lookaside buffer (TLB) 536, which is coupled to an instruction fetch unit 538, which is coupled to a decode unit 540. The decode unit 540 (also known as a decoder) may decode instructions, and generate as an output one or more micro-operations, micro-code entry points, microinstructions, other instructions, or other control signals, which are decoded from, or which otherwise reflect, or are derived from, the original instructions. The decoder 540 may be implemented using various different mechanisms. Examples of suitable mechanisms include, but are not limited to, look-up tables, hardware implementations, programmable logic arrays (PLAs), microcode read only memories (ROMs), etc. The instruction cache unit 534 is further coupled to the memory unit 570. The decode unit 540 is coupled to a rename/allocator unit 552 in the execution engine unit 550.

The execution engine unit 550 includes the rename/allocator unit 552 coupled to a retirement unit 554 and a set of one or more scheduler unit(s) 556. The scheduler unit(s) 556 represents any number of different schedulers, including reservations stations (RS), central instruction window, etc. The scheduler unit(s) 556 is coupled to the physical register file(s) unit(s) 558. Each of the physical register file(s) units 558 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 558 is overlapped by the retirement unit 554 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 554 and the physical register file(s) unit(s) 558 are coupled to the execution cluster(s) 560. The execution cluster(s) 560 includes a set of one or more execution units 562 and a set of one or more memory access units 564. The execution units 562 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 556, physical register file(s) unit(s) 558, and execution cluster(s) 560 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 564). It should also be understood that where separate pipelines are used, one or more of these pipelines may be out-of-order issue/execution and the rest in-order.

The set of memory access units 564 is coupled to the memory unit 570, which may include a data prefetcher 580, a data TLB unit 572, a data cache unit (DCU) 574, and a level 2 (L2) cache unit 576, to name a few examples. In some embodiments DCU 574 is also known as a first level data cache (L1 cache). The DCU 574 may handle multiple outstanding cache misses and continue to service incoming stores and loads. It also supports maintaining cache coherency. The data TLB unit 572 is a cache used to improve virtual address translation speed by mapping virtual and physical address spaces. In one exemplary embodiment, the memory access units 564 may include a load unit, a store address unit, and a store data unit, each of which is coupled to the data TLB unit 572 in the memory unit 570. The L2 cache unit 576 may be coupled to one or more other levels of cache and eventually to a main memory.

In one embodiment, the data prefetcher 580 speculatively loads/prefetches data to the DCU 574 by automatically predicting which data a program is about to consume. Prefetching may refer to transferring data stored in one memory location (e.g., position) of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 500 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIG. 5B is a block diagram illustrating an in-order pipeline and a register renaming stage, out-of-order issue/execution pipeline implemented by processor 500 of FIG. 5A according to some embodiments of the disclosure. The solid lined boxes in FIG. 5B illustrate an in-order pipeline, while the dashed lined boxes illustrates a register renaming, out-of-order issue/execution pipeline. In FIG. 5B, a processor pipeline 500 includes a fetch stage 502, a length decode stage 504, a decode stage 506, an allocation stage 508, a renaming stage 510, a scheduling (also known as a dispatch or issue) stage 512, a register read/memory read stage 514, an execute stage 516, a write back/memory write stage 518, an exception handling stage 522, and a commit stage 524. In some embodiments, the ordering of stages 502-524 may be different than illustrated and are not limited to the specific ordering shown in FIG. 5B.

Figure 6:
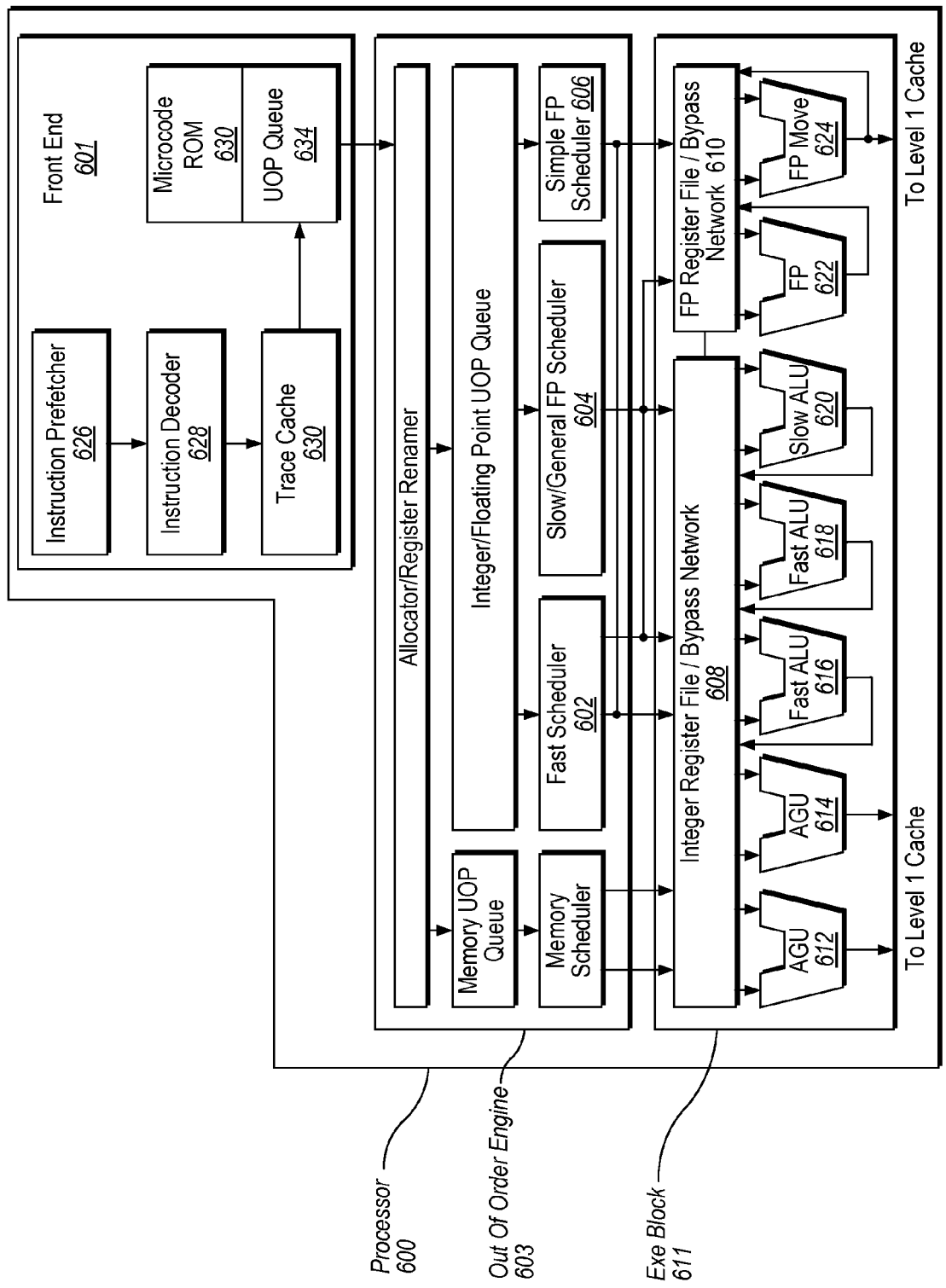
FIG. 6 illustrates a block diagram of the micro-architecture for a processor that includes logic circuits to perform compression/decompression optimization in solid-state memory devices according to one embodiment.

FIG. 6 illustrates a block diagram of the micro-architecture for a processor 600 that includes logic circuits to perform compression/decompression optimization in solid-state memory devices according to one embodiment. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 601 is the part of the processor 600 that fetches instructions to be executed and prepares them to be used later in the processor pipeline. The embodiments of the page additions and content copying can be implemented in processor 600.

The front end 601 may include several units. In one embodiment, the instruction prefetcher 616 fetches instructions from memory and feeds them to an instruction decoder 618 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 630 takes decoded uops and assembles them into program ordered sequences or traces in the uop queue 634 for execution. When the trace cache 630 encounters a complex instruction, the microcode ROM 632 provides the uops needed to complete the operation.

Some instructions are converted into a single micro-op, whereas others need several micro-ops to complete the full operation. In one embodiment, if more than four micro-ops are needed to complete an instruction, the decoder 618 accesses the microcode ROM 632 to do the instruction. For one embodiment, an instruction can be decoded into a small number of micro ops for processing at the instruction decoder 618. In another embodiment, an instruction can be stored within the microcode ROM 632 should a number of micro-ops be needed to accomplish the operation. The trace cache 630 refers to an entry point programmable logic array (PLA) to determine a correct micro-instruction pointer for reading the micro-code sequences to complete one or more instructions in accordance with one embodiment from the micro-code ROM 632. After the microcode ROM 632 finishes sequencing micro-ops for an instruction, the front end 601 of the machine resumes fetching micro-ops from the trace cache 630.

The out-of-order execution engine 603 is where the instructions are prepared for execution. The out-of-order execution logic has a number of buffers to smooth out and reorder the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 602, slow/general floating point scheduler 604, and simple floating point scheduler 606. The uop schedulers 602, 604, 606, determine when a uop is ready to execute based on the readiness of their dependent input register operand sources and the availability of the execution resources the uops need to complete their operation. The fast scheduler 602 of one embodiment can schedule on each half of the main clock cycle while the other schedulers can only schedule once per main processor clock cycle. The schedulers arbitrate for the dispatch ports to schedule uops for execution.

Register files 608, 610, sit between the schedulers 602, 604, 606, and the execution units 612, 614, 616, 618, 610, 612, 614 in the execution block 611. There is a separate register file 608, 610, for integer and floating point operations, respectively. Each register file 608, 610, of one embodiment also includes a bypass network that can bypass or forward just completed results that have not yet been written into the register file to new dependent uops. The integer register file 608 and the floating point register file 610 are also capable of communicating data with the other. For one embodiment, the integer register file 608 is split into two separate register files, one register file for the low order 32 bits of data and a second register file for the high order 32 bits of data. The floating point register file 610 of one embodiment has 128 bit wide entries because floating point instructions typically have operands from 64 to 128 bits in width.

The execution block 611 contains the execution units 612, 614, 616, 618, 610, 612, 614, where the instructions are actually executed. This section includes the register files 608, 610, that store the integer and floating point data operand values that the micro-instructions need to execute. The processor 600 of one embodiment is comprised of a number of execution units: address generation unit (AGU) 612, AGU 614, fast ALU 616, fast ALU 618, slow ALU 610, floating point ALU 612, floating point move unit 614. For one embodiment, the floating point execution blocks 612, 614, execute floating point, MMX, SIMD, and SSE, or other operations. The floating point ALU 612 of one embodiment includes a 64 bit by 64 bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 616, 618. The fast ALUs 616, 618, of one embodiment can execute fast operations with an effective latency of half a clock cycle. For one embodiment, most complex integer operations go to the slow ALU 610 as the slow ALU 610 includes integer execution hardware for long latency type of operations, such as a multiplier, shifts, flag logic, and branch processing. Memory load/store operations are executed by the AGUs 612, 614. For one embodiment, the integer ALUs 616, 618, 610, are described in the context of performing integer operations on 64 bit data operands. In alternative embodiments, the ALUs 616, 618, 610, can be implemented to support a variety of data bits including 16, 32, 128, 256, etc. Similarly, the floating point units 612, 614, can be implemented to support a range of operands having bits of various widths. For one embodiment, the floating point units 612, 614, can operate on 128 bits wide packed data operands in conjunction with SIMD and multimedia instructions.

In one embodiment, the uops schedulers 602, 604, 606, dispatch dependent operations before the parent load has finished executing. As uops are speculatively scheduled and executed in processor 600, the processor 600 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 600 also includes logic to implement compression/decompression optimization in solid-state memory devices according to one embodiment. In one embodiment, the execution block 611 of processor 600 may include MCU 115, to perform compression/decompression optimization in solid-state memory devices according to the description herein.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 7:
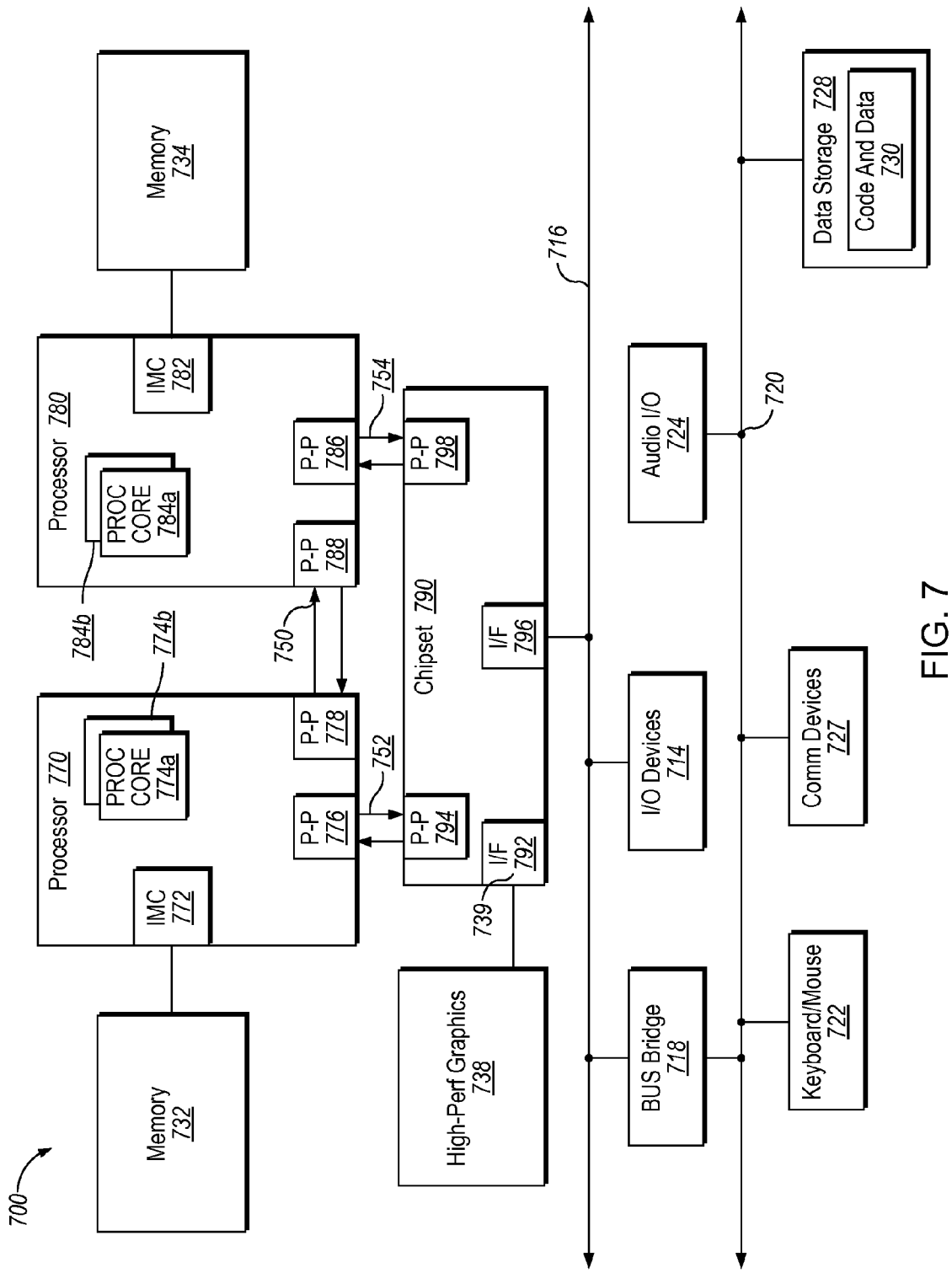
FIG. 7 is a block diagram of a computer system according to one implementation.

Embodiments may be implemented in many different system types. Referring now to FIG. 7, shown is a block diagram of a multiprocessor system 700 in accordance with an implementation. As shown in FIG. 7, multiprocessor system 700 is a point-to-point interconnect system, and includes a first processor 770 and a second processor 780 coupled via a point-to-point interconnect 750. As shown in FIG. 7, each of processors 770 and 780 may be multicore processors, including first and second processor cores (i.e., processor cores 774a and 774b and processor cores 784a and 784b), although potentially many more cores may be present in the processors. The processors each may include hybrid write mode logics in accordance with an embodiment of the present. The embodiments of the page additions and content copying can be implemented in the processor 770, processor 780, or both.

While shown with two processors 770, 780, it is to be understood that the scope of the present disclosure is not so limited. In other implementations, one or more additional processors may be present in a given processor.

Processors 770 and 780 are shown including integrated memory controller units 772 and 782, respectively. Processor 770 also includes as part of its bus controller units point-to-point (P-P) interfaces 776 and 788; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures are possible. For example, instead of the point-to-point architecture of FIG. 7, a system may implement a multi-drop bus or other such architecture.

Figure 8:
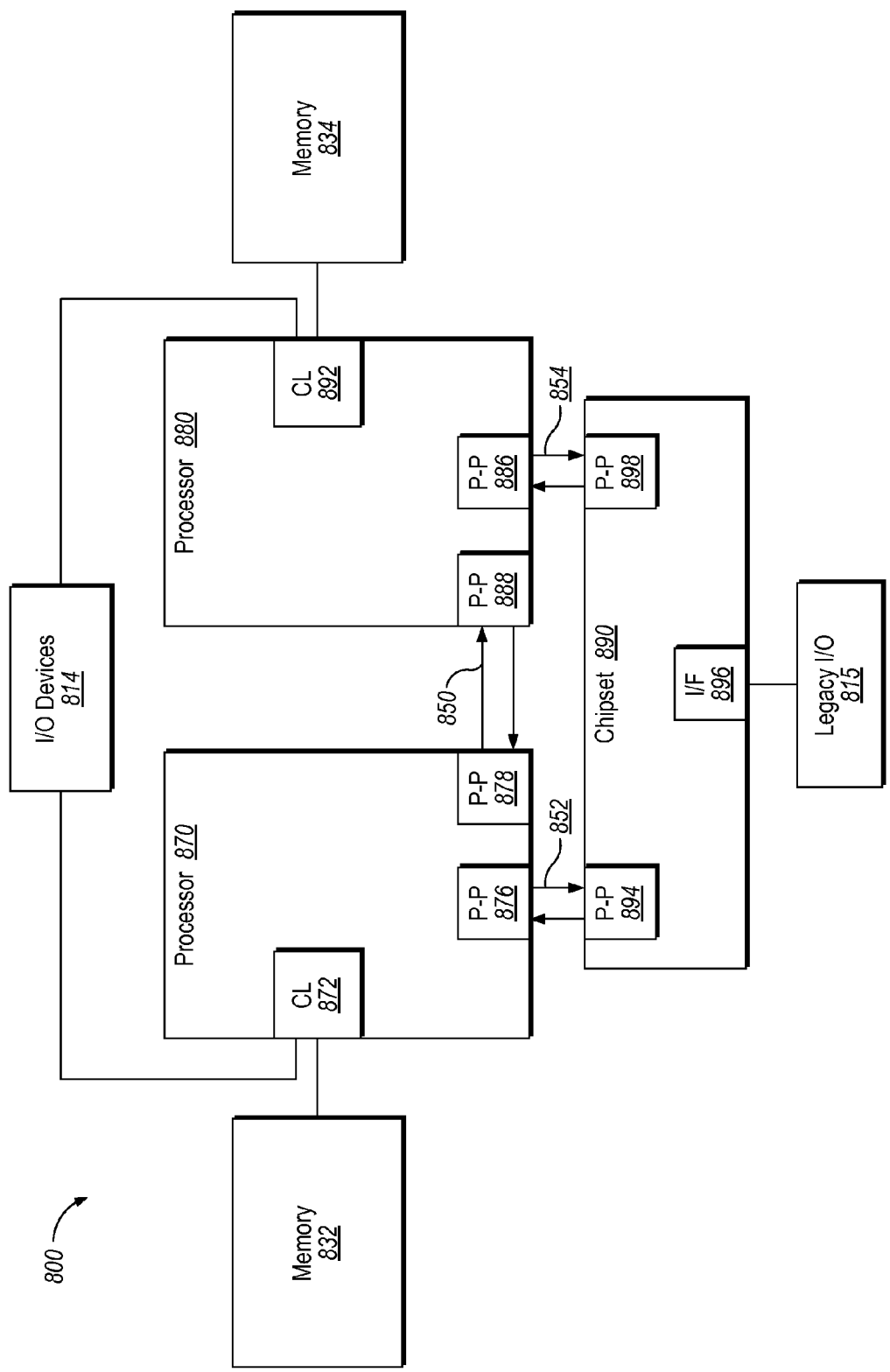
FIG. 8 is a block diagram of a computer system according to another implementation.

Referring now to FIG. 8, shown is a block diagram of a third system 800 in accordance with an embodiment of the present disclosure. Like elements in FIGS. 7 and 8 bear like reference numerals, and certain aspects of FIG. 7 have been omitted from FIG. 7 in order to avoid obscuring other aspects of FIG. 8.

FIG. 8 illustrates that the processors 870, 880 may include integrated memory and I/O control logic ("CL") 872 and 882, respectively. For at least one embodiment, the CL 872, 882 may include integrated memory controller units such as described herein. In addition. CL 872, 882 may also include I/O control logic. FIG. 8 illustrates that the memories 832, 834 are coupled to the CL 872, 882, and that I/O devices 814 are also coupled to the control logic 872, 882. Legacy I/O devices 815 are coupled to the chipset 890. The embodiments of the page additions and content copying can be implemented in processor 870, processor 880, or both.

Figure 9:
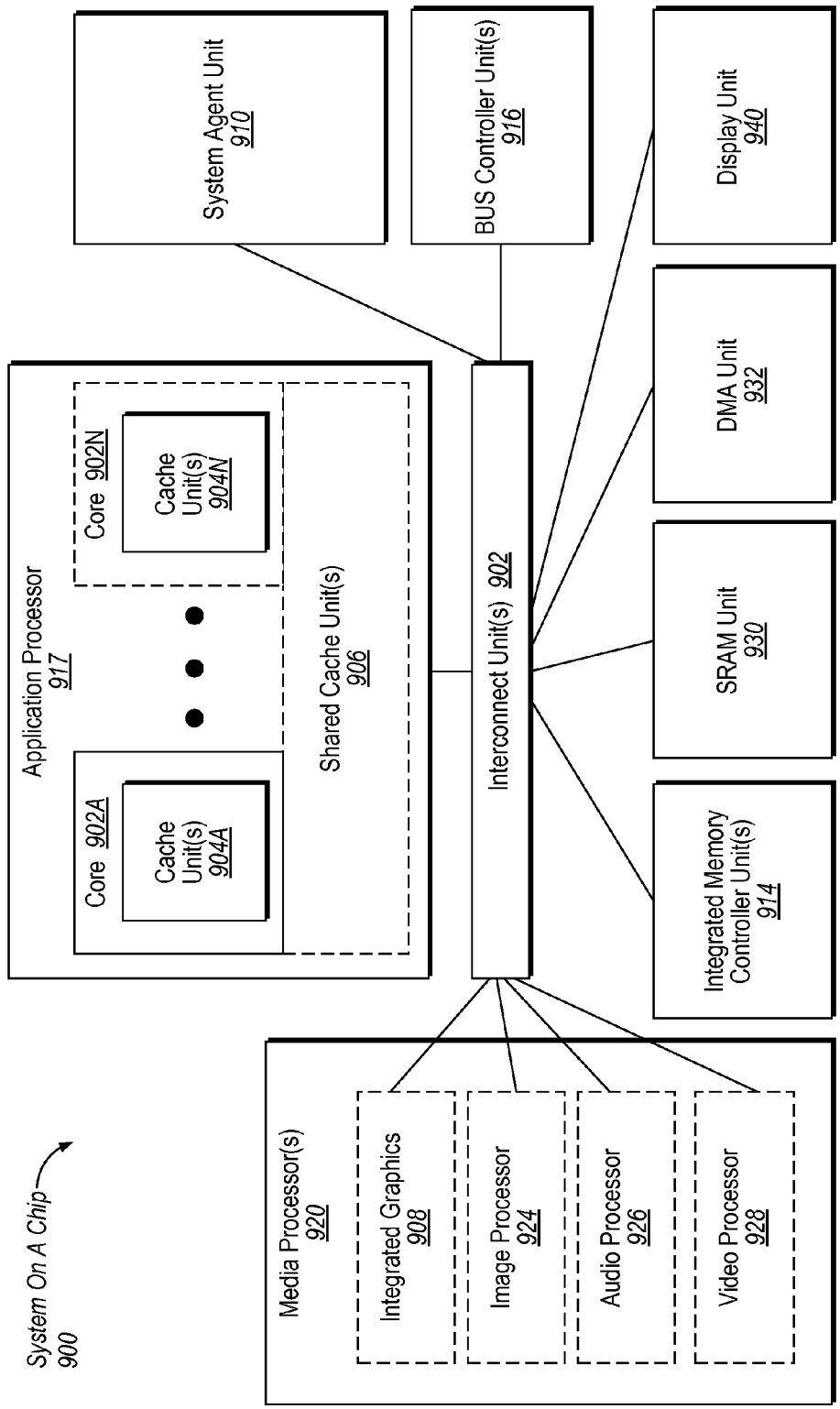
FIG. 9 is a block diagram of a system-on-a-chip according to one implementation.

FIG. 9 is an exemplary system on a chip (SoC) 900 that may include one or more of the cores 902. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

FIG. 9 is a block diagram of a SoC 900 in accordance with an embodiment of the present disclosure. Dashed lined boxes are features on more advanced SoCs. In FIG. 9 an interconnect unit(s) 902 is coupled to: an application processor 917 which includes a set of one or more cores 902A-N and shared cache unit(s) 906; a system agent unit 910; a bus controller unit(s) 916; an integrated memory controller unit(s) 914; a set or one or more media processors 920 which may include integrated graphics logic 908, an image processor 924 for providing still and/or video camera functionality, an audio processor 926 for providing hardware audio acceleration, and a video processor 928 for providing video encode/decode acceleration; a static random access memory (SRAM) unit 930; a direct memory access (DMA) unit 932; and a display unit 940 for coupling to one or more external displays. The embodiments of the pages additions and content copying can be implemented in SoC 900.

Figure 10:
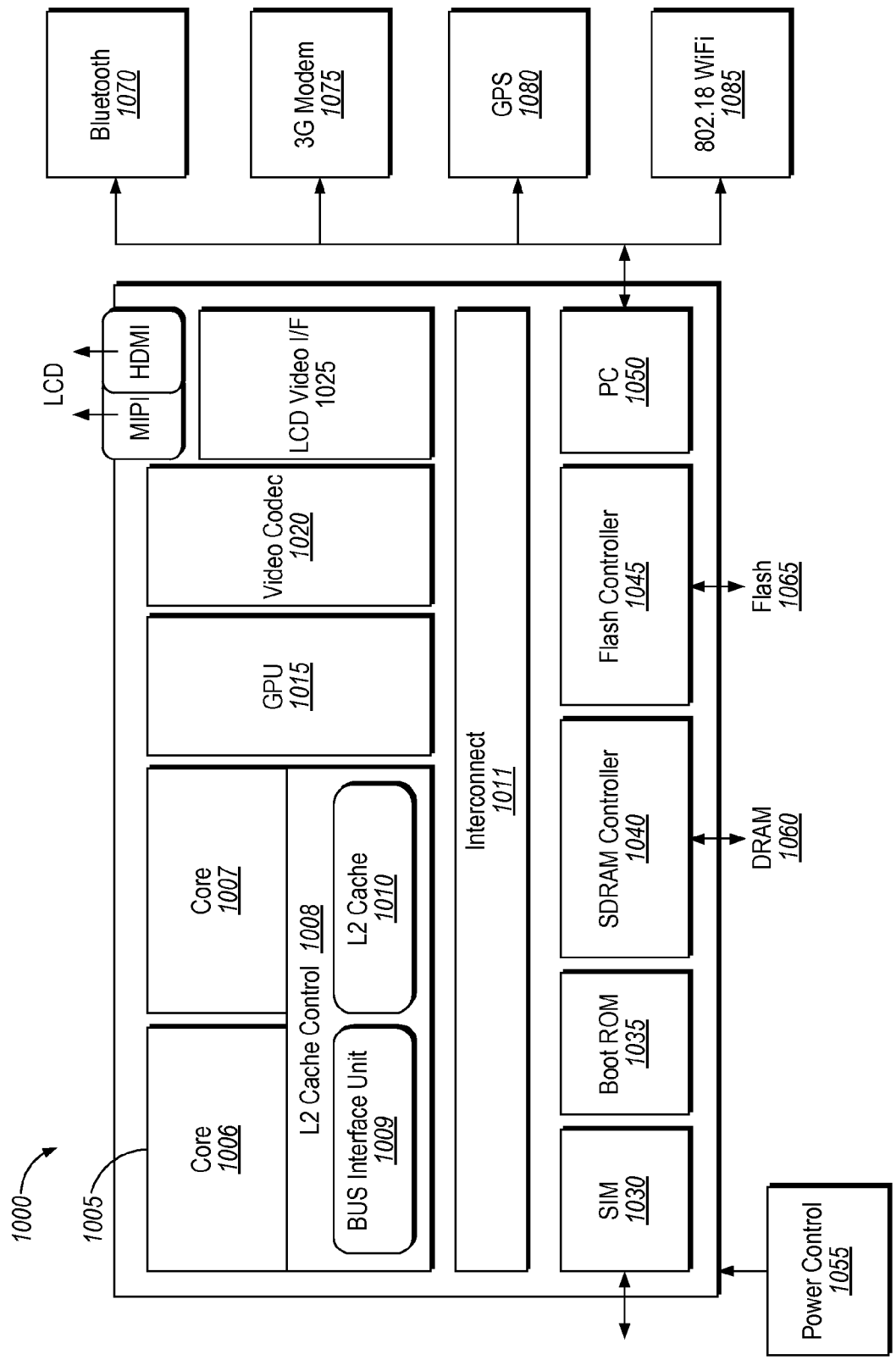
FIG. 10 illustrates another implementation of a block diagram for a computing system.

Turning next to FIG. 10, an embodiment of a system on-chip (SoC) design in accordance with embodiments of the disclosure is depicted. As an illustrative example, SoC 1000 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which can correspond in nature to a mobile station (MS) in a GSM network. The embodiments of the page additions and content copying can be implemented in SoC 1000.

Here, SoC 1000 includes 2 cores—1006 and 1007. Similar to the discussion above, cores 1006 and 1007 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1006 and 1007 are coupled to cache control 1008 that is associated with bus interface unit 1009 and L2 cache 1010 to communicate with other parts of system 1000. Interconnect 1011 includes an on-chip interconnect, such as an IOSF, AMBA, or other interconnects discussed above, which can implement one or more aspects of the described disclosure.

Interconnect 1011 provides communication channels to the other components, such as a Subscriber Identity Module (SIM) 1030 to interface with a SIM card, a boot ROM 1035 to hold boot code for execution by cores 1006 and 1007 to initialize and boot SoC 1000, a SDRAM controller 1040 to interface with external memory (e.g. DRAM 1060), a flash controller 1045 to interface with non-volatile memory (e.g. Flash 1065), a peripheral control 1050 (e.g. Serial Peripheral Interface) to interface with peripherals, video codecs 1020 and Video interface 1025 to display and receive input (e.g. touch enabled input), GPU 1015 to perform graphics related computations, etc. Any of these interfaces may incorporate aspects of the embodiments described herein.

In addition, the system illustrates peripherals for communication, such as a Bluetooth module 1070, 3G modem 1075, GPS 1080, and Wi-Fi 1085. Note as stated above, a UE includes a radio for communication. As a result, these peripheral communication modules may not all be included. However, in a UE some form of a radio for external communication should be included.

Figure 11:
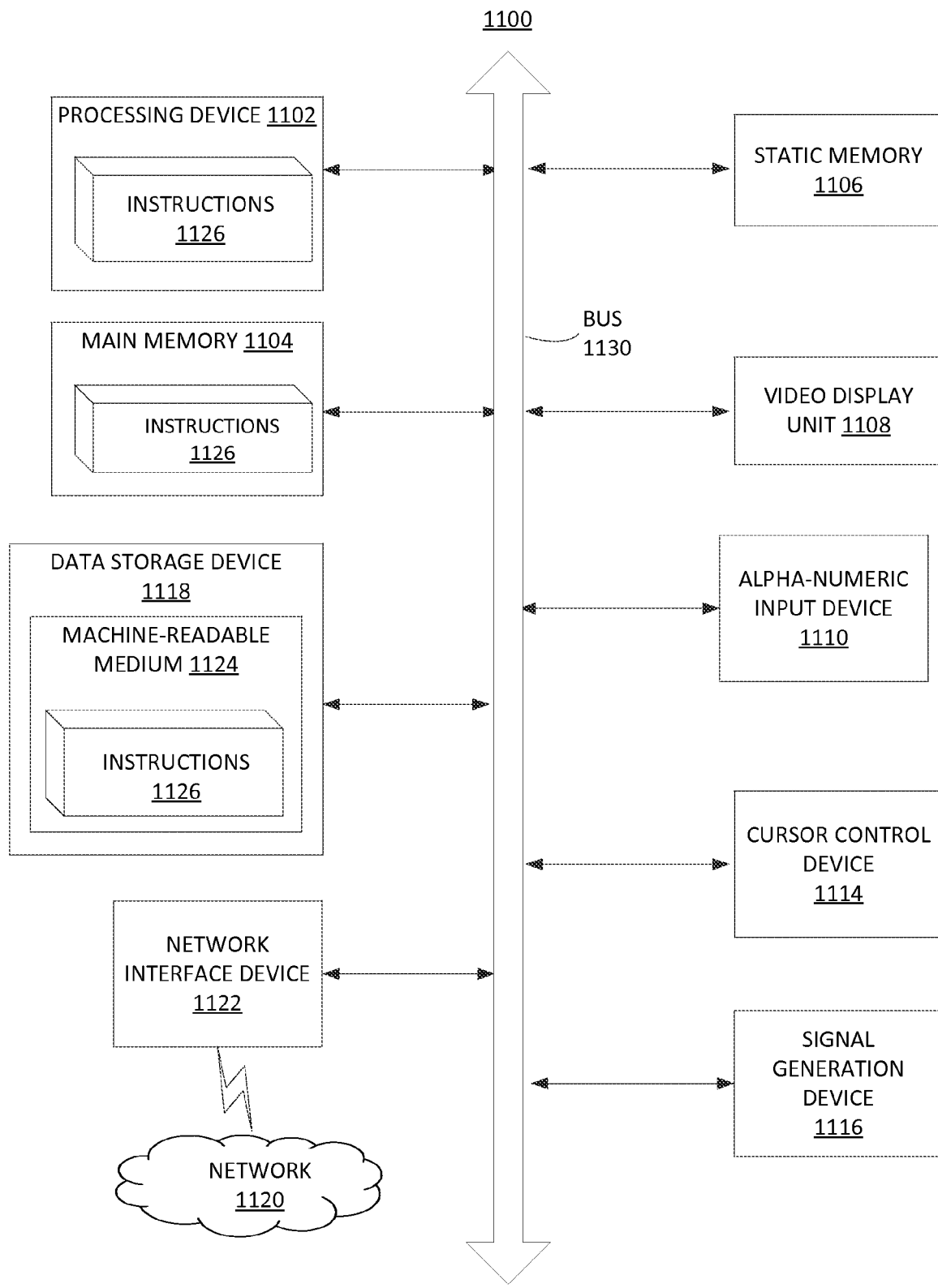
FIG. 11 illustrates another implementation of a block diagram for a computing system.

FIG. 11 illustrates a diagrammatic representation of a machine in the example form of a computing system 1100 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. The embodiments of the page additions and content copying can be implemented in computing system 1100.

The computing system 1100 includes a processing device 1102, main memory 1104 (e.g., read-only memory (ROM), flash memory, dynamic random access memory (DRAM) (such as synchronous DRAM (SDRAM) or DRAM (RDRAM), etc.), a static memory 1106 (e.g., flash memory, static random access memory (SRAM), etc.), and a data storage device 1118, which communicate with each other via a bus 1130.

Processing device 1102 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. In one embodiment, processing device 1102 may include one or processor cores. The processing device 1102 is configured to execute the processing logic 1126 for performing the operations discussed herein. In one embodiment, processing device 1102 can be part of the computing system 100 of FIG. 1. Alternatively, the computing system 1100 can include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

The computing system 1100 may further include a network interface device 1108 communicably coupled to a network 1120. The computing system 1100 also may include a video display unit 1110 (e.g., a liquid crystal display (LCD) or a cathode ray tube (CRT)), an alphanumeric input device 1110 (e.g., a keyboard), a cursor control device 1114 (e.g., a mouse), a signal generation device 1116 (e.g., a speaker), or other peripheral devices. Furthermore, computing system 1100 may include a graphics processing unit 1122, a video processing unit 1128 and an audio processing unit 1132. In another embodiment, the computing system 1100 may include a chipset (not illustrated), which refers to a group of integrated circuits, or chips, that are designed to work with the processing device 1102 and controls communications between the processing device 1102 and external devices. For example, the chipset may be a set of chips on a motherboard that links the processing device 1102 to very high-speed devices, such as main memory 1104 and graphic controllers, as well as linking the processing device 1102 to lower-speed peripheral buses of peripherals, such as USB, PCI or ISA buses.

The data storage device 1118 may include a computer-readable storage medium 1124 on which is stored software 1126 embodying any one or more of the methodologies of functions described herein. The software 1126 may also reside, completely or at least partially, within the main memory 1104 as instructions 1126 and/or within the processing device 1102 as processing logic 1126 during execution thereof by the computing system 1100; the main memory 1104 and the processing device 1102 also constituting computer-readable storage media.

The computer-readable storage medium 1124 may also be used to store instructions 1126 utilizing the processing device 1102, such as described with respect to FIG. 1, and/or a software library containing methods that call the above applications. While the computer-readable storage medium 1124 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

The following examples pertain to further embodiments.

Example 1 is an apparatus comprising: 1) a data input interface to receive an input stream to be compressed; 2) a data output interface to provide a compressed stream; 3) a history buffer of a fixed size that is a fraction of a size of a data buffer used to read the input stream; and 4) processing logic to encode, into the compressed stream, element types comprising literals and pointers, wherein the pointers reference copies of data found elsewhere within the input stream passing through the history buffer during compression.

In Example 2, the apparatus of Example 1, wherein the history buffer is about half the size of the data buffer and comprises a width of at least sixteen bytes.

In Example 3, the apparatus of Examples 1-2, wherein the history buffer comprises multiple banks of memory located side by side, and wherein the processing logic further to store data from the input stream sequentially across rows of the multiple banks.

In Example 4, the apparatus of Example 1-3, wherein the history buffer is two kilobytes in size and comprises four banks of memory, located side by side, each eight bytes in width.

In Example 5, the apparatus of Examples 1-4, wherein the pointers are two bytes in size and a minimum match length is set to four bytes.

In Example 6, the apparatus of Example 1-5, wherein one bit of the pointers encodes for element type and four bits of the pointers encode for length of the copies, such that copies comprise lengths between four and nineteen bytes.

In Example 7, the apparatus of Examples 1-6, wherein eleven bits of the pointers encode offset of back reference to a copy.

In Example 8, the apparatus of Examples 1-7, wherein the literals comprise a tag byte, one bit encoding for element type and seven bits encoding for length of a literal that follows the tag byte.

Various embodiments may have different combinations of the structural features described above. For instance, all optional features of the computing system described above may also be implemented with respect to the method or process described herein and specifics in the examples may be used anywhere in one or more embodiments.

Example 9 is an apparatus comprising: 1) a data input interface to receive a compressed stream to be decompressed; 2) a data output interface to provide a decompressed stream for use by a receiving device; 3) a history buffer of a fixed size that is a fraction of a size of a data buffer used to store the decompressed stream; and 4) processing logic to decode element types sequentially along the compressed stream, to output bytes corresponding to the element types deterministically, and to store a certain number of most-recently decoded bytes within the history buffer; 5) wherein the element types comprise literals and pointers, and wherein the pointers reference copies of data found elsewhere within the compressed stream.

In Example 10, the apparatus of Example 9, further comprising: a) an output buffer to which is sent the output bytes, the output buffer communicatively coupled with the data output interface.

In Example 11, the apparatus of Examples 9-10, wherein the processing logic is further to analyze the pointers in the compressed stream and to: a) for a first pointer that references data within a predetermined distance, send the first pointer to a forwarding pipeline for lookup; and b) for a second pointer that references data outside of the predetermined distance, read data from a referenced location within the history buffer.

In Example 12, the apparatus of Examples 9-11, wherein the history buffer is about half the size of the data buffer and comprises a width of at least eight bytes.

In Example 13, the apparatus of Examples 9-12, wherein the history buffer comprises multiple banks of memory located side by side, and wherein the processing logic further to store data from the input stream sequentially across rows of the multiple banks.

In Example 14, the apparatus of Examples 9-13, wherein the history buffer is two kilobytes in size and comprises two banks of memory, located side by side, each eight bytes in width.

In Example 15, the apparatus of Examples 9-14, wherein the pointers are two bytes in size and a minimum match length is set to four bytes.

In Example 16, the apparatus of Examples 9-15, wherein one bit of the pointers encodes for element type and four bits of the pointers encode for length of the copies, such that copies comprise lengths between four and nineteen bytes.

In Example 17, the apparatus of Examples 9-16, wherein eleven bits of the pointers encode offset of back reference to a copy.

In Example 18, the apparatus of Examples 9-17, wherein the literals comprise a tag byte, one bit encoding for element type and seven bits encoding for length of a literal that follows the tag byte.

Various embodiments may have different combinations of the structural features described above. For instance, all optional features of the processors and methods described above may also be implemented with respect to a system described herein and specifics in the examples may be used anywhere in one or more embodiments.

Example 19 is a solid-state drive (SSD) comprising: 1) array of semiconductor memory to store data; 2) a data input interface to receive an input stream to be compressed; 3) a data output interface to provide a compressed stream to be stored in the semiconductor memory; 4) a history buffer of a fixed size that is a fraction of a size of a data buffer used to read the input stream; and 5) processing logic to encode, into the compressed stream, element types comprising literals and pointers, wherein the pointers reference copies of data found elsewhere within the input stream passing through the history buffer during compression, and are of a fixed size.

In Example 20, the SSD of Example 19, wherein the history buffer is about half the size of the data buffer and comprises a width of at least sixteen bytes.

In Example 21, the SSD of Examples 10-20, wherein the history buffer comprises multiple banks of memory located side by side, and wherein the processing logic further to store data from the input stream sequentially across rows of the multiple banks.

In Example 22, the SSD of Examples 19-21, wherein the history buffer is two kilobytes in size and comprises four banks of memory, located side by side, each eight bytes in width.

In Example 23, the SSD of Examples 19-22, wherein the pointers are two bytes in size, wherein one bit of the pointers encodes for element type, four bits of the pointers encode for length of the copies, and eleven bits of the pointers encode offset of back reference to a copy, such that copies comprise lengths between four and nineteen bytes.

In Example 24, the SSD of Examples 19-23, wherein the literals comprise a tag byte, one bit encoding for element type and seven bits encoding for length of a literal that follows the tag byte.

Various embodiments may have different combinations of the structural features described above. For instance, all optional features of the processors and methods described above may also be implemented with respect to a system described herein and specifics in the examples may be used anywhere in one or more embodiments.

Example 25 is a solid-state drive (SSD) comprising: 1) array of semiconductor memory to store data; 2) a data input interface to receive a compressed stream from the semiconductor memory to be decompressed; 3) a data output interface to provide a decompressed stream for use by a receiving device; 4) a history buffer of a fixed size that is a fraction of a size of a data buffer used to store the decompressed stream; and 5) processing logic to decode element types sequentially along the compressed stream, to output bytes corresponding to the element types deterministically, and to store a certain number of most-recently decoded bytes within the history buffer; 6) wherein the element types comprise literals and pointers, and wherein the pointers reference copies of data found elsewhere within the compressed stream and are of a fixed size.

In Example 26, the SSD of Example 25, further comprising: a) an output buffer to which is sent the output bytes, the output buffer communicatively coupled with the data output interface.

In Example 27, the SSD of Examples 25-26, wherein the processing logic is further to analyze the pointers in the compressed stream and to: a) for a first pointer that references data within a predetermined distance, send the first pointer to a forwarding pipeline for lookup; and b) for a second pointer that references data outside of the predetermined distance, read data from a referenced location within the history buffer.

In Example 28, the SSD of Examples 25-27, wherein the history buffer is about half the size of the data buffer and comprises a width of at least eight bytes, wherein the history buffer comprises multiple banks of memory located side by side, and wherein the processing logic further to store data from the input stream sequentially across rows of the multiple banks.

In Example 29, the SSD of Examples 25-28, wherein the history buffer is two kilobytes in size and comprises two banks of memory, located side by side, each eight bytes in width.

In Example 30, the SSD of Examples 25-29, wherein the pointers are two bytes in size, wherein one bit of the pointers encodes for element type, four bits of the pointers encode for length of the copies, and eleven bits of the pointers encode offset of back reference to a copy, such that copies comprise lengths between four and nineteen bytes.

In Example 31, the SSD of Examples 25-30, wherein the literals comprise a tag byte, one bit encoding for element type and seven bits encoding for length of a literal that follows the tag byte.

Various embodiments may have different combinations of the structural features described above. For instance, all optional features of the processors and methods described above may also be implemented with respect to a system described herein and specifics in the examples may be used anywhere in one or more embodiments.

Example 32 is a method comprising: a) identifying a data buffer size of solid-state drive (SSD) memory to store an input stream of data; b) sizing a history buffer of a compression engine to be of a fixed size that is a fraction of a size of the data buffer; c) adapting, using at least one processor, compression processing logic to function with the history buffer of the fixed size when executed by the compression engine; and d) setting pointers generated by the compression engine to a fixed number of bytes, the pointers to reference copies of records within the input stream larger than the fixed number bytes.

In Example 33, the method of Example 32, wherein sizing the history buffer further comprises: a) setting size of the history buffer to about half the size of the data buffer and to include a width of at least sixteen bytes.

In Example 34, the method of Examples 32-33, wherein sizing the history buffer further comprises: a) partitioning the history buffer to include multiple banks of memory located side by side; and b) updating the compression processing logic to store data from the input stream sequentially across rows of the multiple banks.

In Example 35, the method of Examples 32-34, wherein the pointers are two bytes in size.

In Example 36, the method of Examples 32-35, wherein one bit of the pointers encodes for element type, four bits of the pointers encode for length of the copies, and eleven bits of the pointers encode offset of back reference to a copy, such that copies comprise lengths between four and nineteen bytes.

Various embodiments may have different combinations of the structural features described above. For instance, all optional features of the processors and methods described above may also be implemented with respect to a system described herein and specifics in the examples may be used anywhere in one or more embodiments Example 37 is a method comprising: 1) identifying a data buffer size of solid-state drive (SSD) memory to store a compressed stream of data to be decompressed; 2) sizing a history buffer of a decompression engine to be of a fixed size that is a fraction of a size of the data buffer; 3) adapting, using at least one processor, decompression processing logic to function with the history buffer of the fixed size when executed by the decompression engine; and 4) setting pointers generated by the decompression engine to a fixed number of bytes, the pointers to reference copies of records within the compressed stream larger than the fixed number bytes.

Example 38, the method of Example 37, further comprising adapting the decompression processing logic to: a) for a first pointer that references data within a predetermined distance, send the first pointer to a forwarding pipeline of the decompression engine for lookup; and b) for a second pointer that references data outside of the predetermined distance, read data from a referenced location within the history buffer.

In Example 39, the method of Examples 37-38, wherein sizing the history buffer further comprises: a) making the history buffer about half the size of the data buffer and to include a width of at least eight bytes.

In Example 40, the method of Examples 37-39, wherein sizing the history buffer further comprises: a) partitioning the history buffer to include multiple banks of memory located side by side; and b) updating the decompression processing logic to store data from the input stream sequentially across rows of the multiple banks.

In Example 41, the method of Examples 37-40, wherein the pointers are two bytes in size, wherein one bit of the pointers encodes for element type, four bits of the pointers encode for length of the copies, and eleven bits of the pointers encode offset of back reference to a copy, such that copies comprise lengths between four and nineteen bytes.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments are described with reference to compression/decompression optimization in solid-state memory devices in specific integrated circuits, such as in computing platforms or microprocessors. The embodiments may also be applicable to other types of integrated circuits and programmable logic devices. For example, the disclosed embodiments are not limited to desktop computer systems or portable computers, such as the Intel® Ultrabooks™ computers. And may be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments may especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure can be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions can be used to cause a general-purpose or special-purpose processor that is programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:

1. An apparatus comprising:
  a data input interface to receive an input stream to be compressed;
  a data output interface to provide a compressed stream;
  a data buffer coupled to the data input interface and to buffer the input stream;
  a history buffer coupled to the data buffer, the history buffer to buffer a delayed version of the input stream, wherein the history buffer is of a fixed size that is a fraction of a size of the data buffer used to read the input stream;
  a compare logic circuit coupled to the data buffer and to the history buffer, the compare logic circuit to compare data from the history buffer to data in the data buffer, to search for data matches of at least a minimum match length;
  an encoder coupled to the compare logic circuit, the encoder to encode, into the compressed stream, element types comprising pointers, the pointers referencing copies of the data matches found elsewhere within the input stream passing through the history buffer during compression, wherein the pointers are a fixed number of bytes; and
  wherein the fixed number of bytes is two and the minimum match length is set to four bytes, wherein one bit of the pointers is encoded with an element type and four bits of the pointers are encoded with a length of the copies, such that copies comprise lengths between four and nineteen bytes, and wherein eleven bits of the pointers are encoded with an offset of a back reference to a copy.

2. The apparatus of claim 1, wherein the history buffer is about half the size of the data buffer and comprises a width of at least sixteen bytes.

3. The apparatus of claim 2, wherein the history buffer comprises multiple banks of memory located side by side, and wherein the compare logic circuit further to store data from the input stream sequentially across rows of the multiple banks.

4. The apparatus of claim 1, wherein the history buffer is two kilobytes in size and comprises four banks of memory, located side by side, each eight bytes in width.

5. The apparatus of claim 1, wherein the element types further comprise literals, wherein a literal comprises a tag byte, one bit encoding for element type and seven bits encoding for length of the literal.

6. An apparatus comprising:
a data input interface to receive a compressed stream to be decompressed;
a data output interface to provide a decompressed stream for use by a receiving device;
a data buffer coupled to the data input interface and to buffer the compressed stream;
a history buffer of a fixed size that is a fraction of a size of the data buffer, the history buffer being used to store the decompressed stream; and
a decompression parser coupled to the data buffer and to the history buffer, the decompression parser to decode element types sequentially along the compressed stream, to output bytes corresponding to the element types deterministically, and to store a certain number of most-recently decoded bytes within the history buffer;
wherein the element types comprise pointers, the pointers referencing copies of data found elsewhere within the compressed stream of at least a minimum match length, the pointers being of a fixed number of bytes; and
wherein the fixed number of bytes is two and the minimum match length is set to four bytes, wherein one bit of the pointers is encoded with an element type and four bits of the pointers are encoded with a length of the copies, such that copies comprise lengths between four and nineteen bytes, and wherein eleven bits of the pointers are encoded with an offset of a back reference to a copy.

7. The apparatus of claim 6, further comprising an output buffer to which is sent the output bytes, the output buffer communicatively coupled with the data output interface.

8. The apparatus of claim 6, wherein the decompression parser is further to analyze the pointers in the compressed stream and to:
for a first pointer that references data within a predetermined distance, send the first pointer to a forwarding pipeline for lookup; and
for a second pointer that references data outside of the predetermined distance, read data from a referenced location within the history buffer.

9. The apparatus of claim 6, wherein the history buffer is about half the size of the data buffer and comprises a width of at least eight bytes.

10. The apparatus of claim 9, wherein the history buffer comprises multiple banks of memory located side by side, and wherein the decompression parser further to store data from the compressed stream sequentially across rows of the multiple banks.

11. The apparatus of claim 6, wherein the history buffer is two kilobytes in size and comprises two banks of memory, located side by side, each eight bytes in width.

12. The apparatus of claim 6, wherein the element types further comprise literals, wherein a literal comprises a tag byte, one bit encoding for element type and seven bits encoding for length of the literal.

13. A method comprising:
identifying a data buffer size of solid-state drive (SSD) memory to store an input stream of data;
sizing a history buffer of a compression engine to be of a fixed size that is a fraction of a size of the data buffer;
adapting, using at least one processor, compression logic of the compression engine to function with the history buffer of the fixed size when executed by the compression engine;
setting pointers generated by the compression engine to a fixed number of bytes, the pointers to reference copies of records within the input stream larger than the fixed number bytes and of at least a minimum match length, wherein the minimum match length specifies a minimum length of a copy of a record;
setting the fixed number of bytes to two and the minimum match length of the pointers to four bytes;
using one bit of the pointers to encode an element type and four bits of the pointers to encode a length of the copies, such that copies comprise lengths between four and nineteen bytes; and
using eleven bits of the pointers to encode an offset of a back reference to a copy.

14. The method of claim 13, wherein sizing the history buffer further comprises setting size of the history buffer to about half the size of the data buffer and to include a width of at least sixteen bytes.

15. The method of claim 14, wherein sizing the history buffer further comprises:
partitioning the history buffer to include multiple banks of memory located side by side; and
adapting the compression logic to store data from the input stream sequentially across rows of the multiple banks.

16. A method comprising:
identifying a data buffer size of solid-state drive (SSD) memory to store a compressed stream of data to be decompressed;
sizing a history buffer of a decompression engine to be of a fixed size that is a fraction of a size of the data buffer;
adapting, using at least one processor, decompression logic of the decompression engine to function with the history buffer of the fixed size when executed by the decompression engine;
setting pointers generated by the decompression engine to a fixed number of bytes, the pointers to reference copies of records within the compressed stream larger than the fixed number bytes and of at least a minimum match length, wherein the minimum match length specifies a minimum length of a copy of a record;
setting the fixed number of bytes to two and the minimum match length of the pointers to four bytes;
using one bit of the pointers to encode an element type and four bits of the pointers to encode a length of the copies, such that copies comprise lengths between four and nineteen bytes; and
using eleven bits of the pointers to encode an offset of a back reference to a copy.

17. The method of claim 16, further comprising adapting the decompression logic to:
for a first pointer that references data within a predetermined distance, send the first pointer to a forwarding pipeline of the decompression engine for lookup; and for a second pointer that references data outside of the predetermined distance, read data from a referenced location within the history buffer.

18. The method of claim 16, wherein sizing the history buffer further comprises making the history buffer about half the size of the data buffer and to include a width of at least eight bytes.

19. The method of claim 18, wherein sizing the history buffer further comprises:
  partitioning the history buffer to include multiple banks of memory located side by side; and
  adapting the decompression logic to store data from the compressed stream sequentially across rows of the multiple banks.

* * * * *